United States Patent
Maltabes et al.

(10) Patent No.: US 6,902,986 B2
(45) Date of Patent: Jun. 7, 2005

(54) METHOD FOR DEFINING ALIGNMENT MARKS IN A SEMICONDUCTOR WAFER

(75) Inventors: John G. Maltabes, Austin, TX (US); Alain Charles, The Sterling #09-04 (SG); Karl E. Mautz, Round Rock, TX (US); Joseph Petrucci, New Milford, CT (US)

(73) Assignee: Freescale Semiconductor, Inc., Austin, TX (US)

( * ) Notice: Subject to any disclaimer, the term of this patent is extended or adjusted under 35 U.S.C. 154(b) by 253 days.

(21) Appl. No.: 10/271,653

(22) Filed: Oct. 15, 2002

(65) Prior Publication Data

US 2004/0072438 A1 Apr. 15, 2004

(51) Int. Cl.[7] .............................................. H01L 21/76
(52) U.S. Cl. ....................................... 438/401; 257/797
(58) Field of Search ................................. 438/401, 700; 257/622, 797

(56) References Cited

U.S. PATENT DOCUMENTS

| | | | | |
|---|---|---|---|---|
| 5,843,226 A | * | 12/1998 | Zhao et al. | .................... 117/97 |
| 5,950,093 A | * | 9/1999 | Wei | ............................. 438/401 |
| 6,271,602 B1 | * | 8/2001 | Ackmann et al. | ........... 257/797 |
| 6,673,635 B1 | * | 1/2004 | Hellig et al. | .................... 438/7 |
| 2002/0102811 A1 | * | 8/2002 | Farrow et al. | .............. 438/401 |

OTHER PUBLICATIONS

Wolf et al., Silicon Processing for the VLSI Era, vol. 1, 1996, p. 427.*

* cited by examiner

Primary Examiner—Duy-Vu N. Deo

(57) ABSTRACT

A lithography and etching method for forming an alignment mark (104) and at least one device feature (such as a shallow trench 105) on a wafer (99) is provided. The etching process (18) comprises: a first etching step (1811) for pre-defining at least one alignment mark (103) and a second etching step (1812) for defining desired semiconductor device patterns (such as a shallow trench 105) on said wafer surface and completing said at least one alignment mark (104).

16 Claims, 3 Drawing Sheets

METHOD FOR DEFINING ALIGNMENT MARKS IN A SEMICONDUCTOR WAFER

FIELD OF THE INVENTION

The present invention generally relates to the manufacture of semiconductor devices on wafers, and more particularly to methods for forming alignment marks on semiconductor wafers, especially in conjunction with semiconductor devices employing shallow trench isolation (STI) or deep trench processes.

BACKGROUND OF THE INVENTION

In using certain types of semiconductor fabrication equipment, alignment marks around the periphery of the wafer are required to properly orient the wafer in a lithography tool. While such marks minimize the chance of alignment errors, there is a disadvantage in that the alignment marks are often required to be made before any other processing occurs (and thus the alignment marks are sometimes referred to as "zero" layer alignment marks). Since the definition of alignment marks has to be finished before any further step can follow, the creation of alignment marks adds a distinct step to the whole process which is time consuming and costly, adding no value to the ultimate semiconductor devices being fabricated on the wafer.

The present invention seeks to provide an optimized process sequence which reduces the number of processing steps and complexity of prior art techniques for forming alignment marks. The invention is particularly suited for forming alignment marks in conjunction with semiconductor devices employing shallow trench isolation.

DETAILED DESCRIPTION OF A PREFERRED EMBODIMENT

Figure 1:
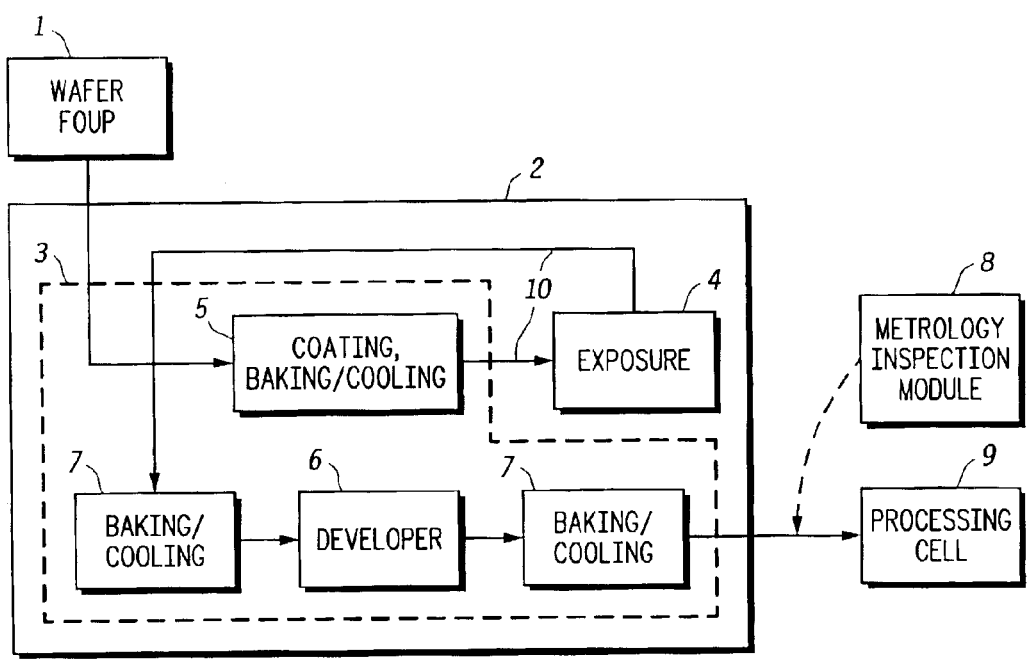
FIG. 1 illustrates a lithography apparatus according to prior art.

Generally, the present invention is based on using two etching steps for obtaining both STI features and alignment marks. In a first etching step at least one alignment mark is pre-defined, and in a second etching step said at least one alignment mark is completed and a desired semiconductor device pattern (e.g. a shallow trench of isolation purposes) is defined on said wafer surface. With the invention, the alignment mark and device pattern can be formed using the same photoresist pattern so that only one photolithography sequence is needed. Thus the zero-layer alignment steps can be eliminated to save manufacturing time and cost.

According to a preferred embodiment of the present invention in the first etching step the wafer is partially etched at the alignment mark, so that the alignment mark has a first predetermined depth and the rest of the wafer remains covered by a lithography resist. The second etching step comprises a first sub-step that is dedicated to removing said lithography resist from the wafer (descum-step) in at least one window for etching circuit features in said window. The first etching step will be very aggressive so as to provide a first predetermined depth of the alignment mark, whereas the first sub-step of the second etching step may be less aggressive since it is only to remove the rest of the lithography resist in predetermined areas (windows). Further the second etching step comprises a second sub-step for etching STI semiconductor device features in said at least one window which is cleared of lithography resist after the first etching sub-step. Moreover, in the second sub-step the alignment mark is concurrently etched to its targeted predetermined (final) depth.

In accordance with one embodiment of the invention, the etches in the alignment mark portions of the wafer and in the device portions of the wafer are controlled differently using any of a variety of masking techniques. In forming a lithography resist mask, the intensity of the exposure of the resist can be modulated using sub-resolution techniques, such as using half-tone reticles (also known as gray-scale reticles) or using a secondary film which attenuates a necessary amount of radiation. Thus, the resist in the alignment mark area can be fully exposed and developed, while the same resist in the device area can be under exposed and not fully developed so that the resist can protect the device area while the alignment mark area is cleared of resist for alignment mark definition. Blading-off selective portions of a mask reticle is another technique which can be used to enable different treatment in the device portions of the wafer as compared to the alignment mark portions. Use of a plasma-developable resist, in combination with a de-scum process (which serves to develop the resist) can also be used to achieve differential etching between the alignment mark regions and the active device regions. The use of these techniques in conjunction with practicing the present invention will be better understood in reference to the description of the figures below.

In embodiments in which the resist is less developed in the device regions than in the alignment mark regions (e.g. using half-toning or blading-off), the resist is completely removed from over the alignment mark regions so that they can be etched into the substrate while resist remains on the active device regions and is protected from the first etch. A second etch is then performed to remove portions of the resist in the device area where trenches are to be formed. This second etch continues to etch the alignment marks deeper for further definition. In an embodiment in which plasma-developable resist is used, the resist would be developed in-situ with the silicon etch processes used to form the alignment marks and device trenches. The develop portion of the etch process would use a reactant-depleted chemistry (typically oxygen with other additive gases) at a moderate pressure and power that would favor rapid development of the alignment marks exposed areas over the device areas. Thus, more resist would be removed (developed out) in the alignment mark areas than in the device areas due to geometry differences between the two regions (with the alignment marks generally being much larger). During the next phase of the etch process, the final layers of the resist in the alignment mark areas would be removed and the underlying silicon substrate would be etched rapidly. This step would be timed or endpointed such that as the device area resist clears, a less aggressive (rapid) etch step would begin that etches the device areas to their proper depth and continues deepening the alignment marks.

The present invention may be better understood in reference to the following detailed description in conjunction with the accompanying drawings. For simplicity and clarity of illustration, the figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the features in the figures may be exaggerated relative to other elements to help to improve understanding of embodiments of the present invention.

Referring to FIG. 1, there is shown a design of a lithography cell and relevant adjacent tools in accordance with the prior art, but which can be used for practicing the present invention. Semiconductor wafers to be processed are carried in a Front Opening Unified Pod (FOUP) 1 which may contain, e.g., twenty-five wafers of 300 millimeters diameter each. The wafer FOUP 1 enters into a lithography cell 2 which comprises as main components a coater tool 3 and an exposure tool 4. The lithography cell 2 is indicated by a rectangle of solid lines which encompasses the coater tool 3 and the exposure tool 4 as its components. The coater tool 3 is indicated by a polygon of dashed lines and comprises a coating means 5, a developer means 6 and a stabilization means 7 for baking/cooling the wafer. (In the following the term "baking" the wafer is meant to include also subsequent "cooling" of the wafer.) After finishing the steps in the lithography cell 2 the wafer is passed on to a processing cell 9 for etching, wet processing, ion implantation, or other wafer fabrication step which is performed with a resist mask formed on the wafer surface.

The tools for lithography processing of the wafer are arranged in a loop, with the transportation paths 10 of the wafers between two adjacent processing means being indicated by solid lines (arrows). The wafer first enters the coating means 5 in the coater tool 3, where it is coated with a lithography resist. After the coating the wafer is passed on to the exposure tool 4, which is normally external to the coating tool 3 since, concerning the physical environment, the requirements for the exposure parameters and environment (vacuum) are different from the requirements for coating, developing and baking/cooling. In the exposure tool 4 the wafer is exposed to irradiation with light, X-rays, electrons or ions through a reticle (not shown). After the exposure in the exposure tool 4 the wafer is returned to the coater tool 3, where it now enters a first stabilization means 7 for stabilizing the lithography resist and activating a chemical reaction. After stabilizing, the wafer is passed on to the developer means 6 and subsequently to a second stabilization means 7 for baking the resist pattern on the surface of the wafer. Accordingly, there are multiple wafers concurrently processed at a time: such as one in the coating means 5, being coated with resist, one in the exposure tool 4, being irradiated with light, electrons, ions etc., and one in the developer means 6 or the stabilization means 7. Behind the stabilization means 7 the wafer exits the lithography cell 2 and enters the processing cell 9 for the further processing.

Before the wafer enters the processing cell 9 for further processing, a metrology inspection of the patterns on its surface is carried out, in order to reject wafers with features on their surface that are not properly oriented with respect to the wafer due to a misalignment of the exposed pattern and underlying pattern that was produced during the preceding lithography processing. This metrology inspection is carried out in a separate metrology inspection tool 8, external to the lithography cell 2 and the processing cell 9, respectively.

Figure 2:
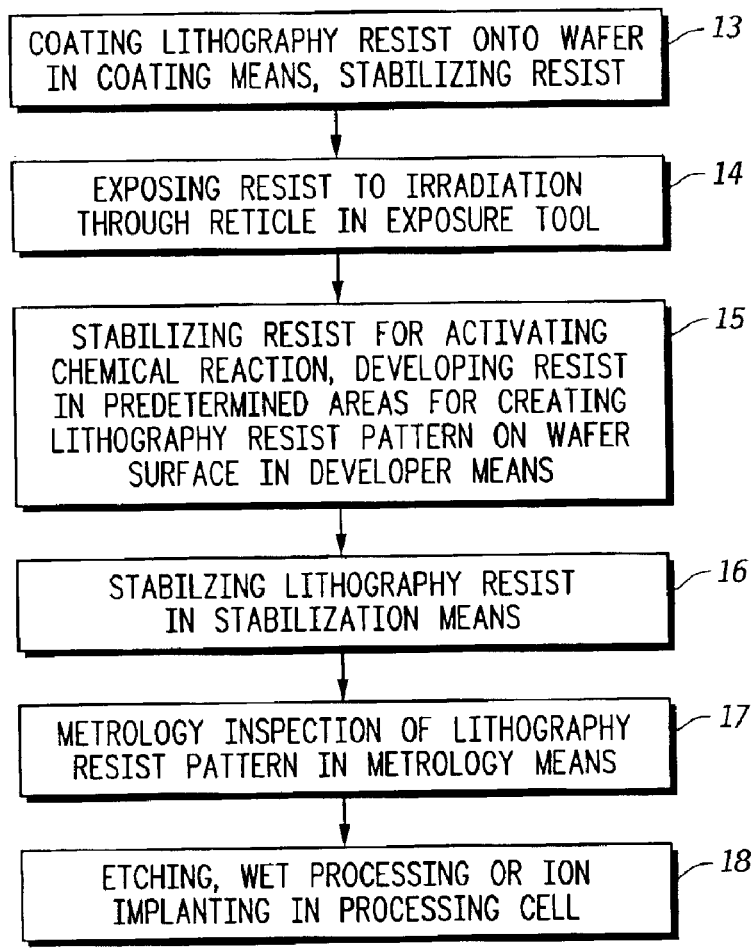
FIG. 2 is a flowchart of the lithography for a semiconductor device on a wafer according to prior art.

The according steps of the pertaining lithography process are presented in flow diagram form in FIG. 2. In an initial step 13 a lithography resist is coated onto the wafer in said coating means 5. Subsequently, at step 14, the wafer with the resist on it is exposed to irradiation with deep UV light, extreme UV light, X-rays, electron or ion beams in the exposure tool 4 through a reticle (not shown). After the exposure 14 of the wafer to an irradiation, the lithography resist on the wafer is stabilized in step 15 for activating a chemical reaction. After exposure the resist is developed in the developer means 6 at step 15 so as to reveal a predetermined lithography resist pattern on a wafer surface. The developed lithography resist is stabilized by baking and subsequent cooling in the stabilization means 7 at step 16 for strengthening said lithography resist pattern on the wafer surface. After the following metrology inspection in the according module 8 at step 17, the batch of wafers is passed on to the processing cell 9. In the processing cell 9 the wafer is processed at step 18, wherein processing may be wet processing, etching, ion implanting of other wafer fabrication step which is performed with a ithography resist mask formed on the surface of the wafer.

Figure 3:
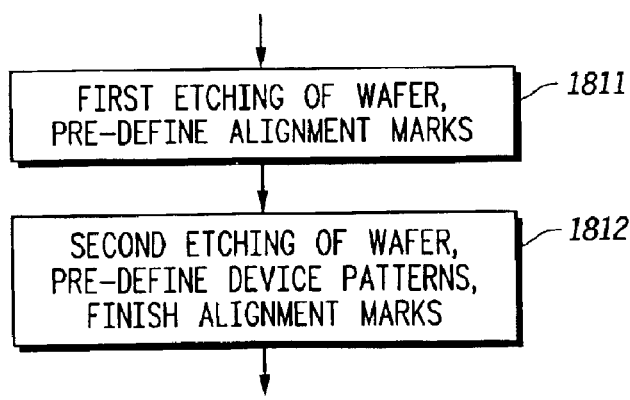
FIG. 3 is a part of the flowchart of FIG. 2 with a detailed presentation of an embodiment of the present invention.

In one embodiment, the present invention is an elaboration on step 18, where step 18 actually includes sub-steps 1811 and 1812 as shown in FIG. 3. In sub-step 1811 a first etching process is carried out, wherein the alignment marks on the wafer are pre-defined. In the subsequent sub-step 1812 the actual semiconductor device patterns (e.g. shallow trenches for isolation) are etched, and in the course of this second etching the pre-defined alignment marks are completed (i.e. the alignment marks are etched twice, whereas the desired semiconductor patterns are etched only once).

Sub-steps 1811 and 1812 of FIG. 3, performed in conjunction with the above described lithography process to create a suitable resist mask, can be better understood in reference to FIGS. 4–7 which illustrate cross-sectional views of a wafer fabricated in accordance with the present invention. More specifically, FIGS. 4–7 illustrate a sequence for etching alignment marks and shallow trench isolation regions in a wafer, however it important to realize that the present invention is not limited to use in forming shallow trench isolation, nor is it limited to being performed at any particular point or stage in the semiconductor manufacturing process.

Figure 4:
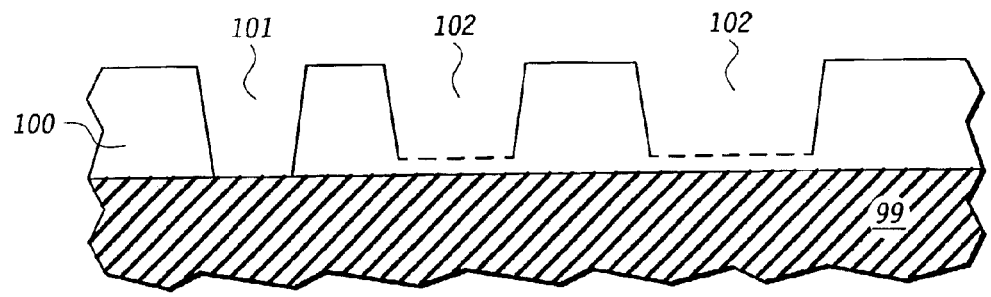
FIGS. 4–7 are cross-sectional, sequential illustrations of using lithography resist and etch techniques to form alignment marks in accordance with one embodiment of the present invention.

FIG. 4 illustrates the situation of the resist on the wafer immediately after the lithography process has been finished. A silicon wafer substrate 99 is covered by a photoresist mask 100 in which windows 101 and 102 are opened for process steps to come. As illustrated, only the window 101 for the alignment mark is completely cleared of the photoresist whereas in the windows 102 some resist is deliberately left on the substrate 99 to prevent etching of the substrate when the alignment mark is etched. Window 101 will typically be located about a periphery of the wafer, where alignment marks are typically made, whereas windows 102 will typically lie within the periphery (i.e. inside the alignment mark windows) where semiconductor devices are to be formed.

One method for creating photoresist mask 100 in which some portions are fully cleared while others are only partially cleared is to underexpose the photoresist in the device portions of the wafers (i.e. the area where windows 102 are to be formed). Blading-off portions of the reticle during the exposure steps is one technique in which the different portions of the wafer can see different levels of exposure. The use of half-tone reticles (also known as grayscale reticles) is another technique to achieve a similar result. A resist thickness of between about 1,000–5,000 Angstroms will sufficiently protect the device regions of the wafer within windows 102 during the subsequent alignment mark etch, yet be sufficiently easy to remove after the alignment mark is etched to permit etching of more shallow trenches in the device regions.

Figure 5:
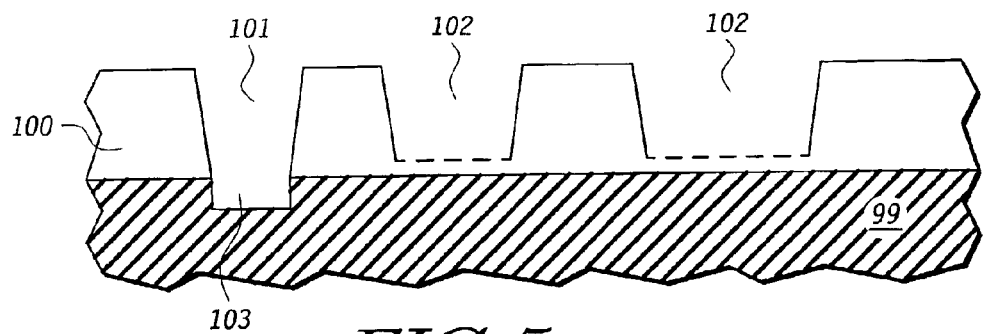

In FIG. 5 the wafer is shown after the alignment mark has been initially etched. At the position of the alignment mark there is a trench 103 in the wafer now which has already almost the desired depth for the alignment mark. For example, the etch is carried out until the depth of trench 103 is about 1.5–2.0 µm or greater. The rest of the resist on the wafer has not been affected by the etching process between FIGS. 4 and 4B, so the height of the resist layer 100 on the wafer remains nearly unchanged in this etching step and only a small amount of it is removed. One suitable etch process which can etch wafer 99 in the alignment mark area without etching or substantially adversely affecting the resist in windows 102 is a fluorine-based (fluorocarbon) etch chemistry with minor (<10%) amounts of argon and/or chlorine. Operating conditions are preferably high power (e.g.>1000 Watts), high DC bias (e.g. >200V) and low pressure (e.g. <25 mTorr).

Figure 6:
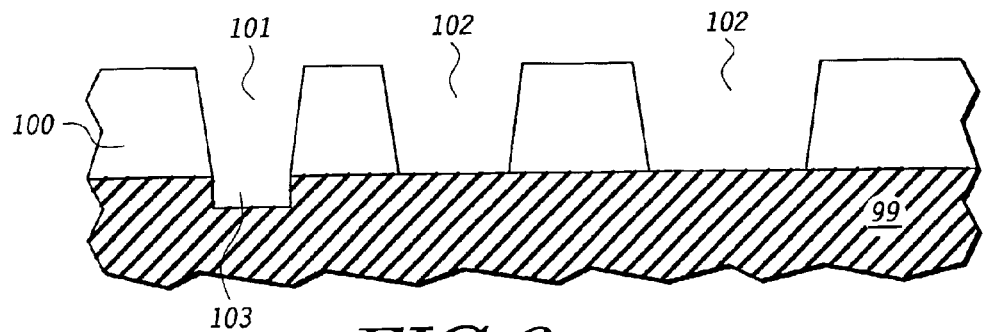

In FIG. 6 the effect of a subsequent resist etch or resist clear is illustrated. As illustrated, the windows 102 with the thin resist layer are cleared of resist to expose underlying portions of the wafer 99 in which a shallow trench will be formed. The thick resist layer 100 may likewise be decreased in height slightly as result, but this is not problematic. The alignment mark trench 103 is almost not changed at all as the etch process can be made to be selective to the underlying substrate wafer material (e.g. silicon). The resist clearing process must carefully remove the protective covering resist from the top of the substrate within windows 102 without excessive damage to the photoresist features sizes (e.g. widths). In a preferred embodiment of the invention, the resist is cleared in this step using a "de-scum" type etch. A de-scum etch is generally an oxygen ($O_2$) gas etch with minor (e.g. <5%) amounts of nitrogen and/or fluorine. Operating conditions are generally low power (e.g. <200 Watts), low DC bias (e.g. <50 V) and moderate pressure (e.g. 50–100 mTorr).

Figure 7:
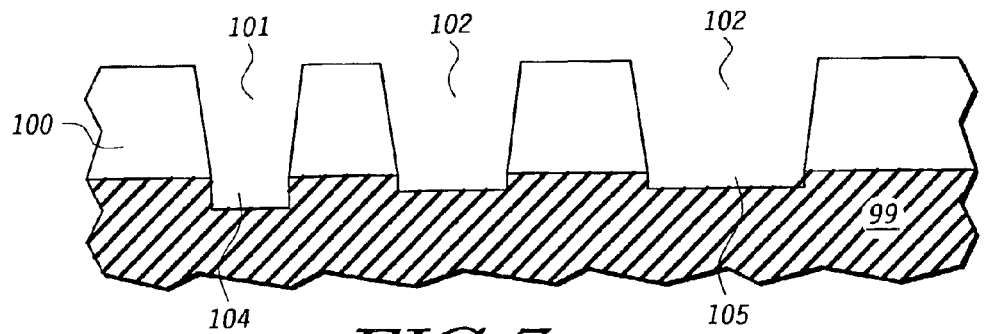

In FIG. 7 the wafer is shown after the substrate has been etched in windows 102 so as to create shallow trenches 105 in the semiconductor wafer within the device regions. As alignment mark trench 103 is likewise exposed to the etch, it will be additionally etched so as to realize a final alignment mark 104 as a deeper trench in the substrate wafer 99 as compared to shallow trenches 105. For example, the final depth of alignment mark trench 104 may be about 2.0 µm or greater while the depth of shallow trenches 105 may be about 0.5 µm or less. It is noted that only after the second etching step the targeted depth of the alignment mark is attained.

Finally the rest of the resist on the wafer is removed in another step and in another tool (not shown), and the wafer undergoes further processing in accordance with conventional practices to form integrated circuits within the device regions of the substrate.

FIGS. 4–7 demonstrate a conceptual process of the invention while the accompanying text of these figures focused on a particular embodiment of the invention in which the two different regions where differentiated by underexposing the resist in the device portions of the substrate. However, one of ordinary skill in the art will appreciate that these same conceptual illustrations can be used to support further understanding of an embodiment in which plasma-developable resist is used, as described above. Both embodiments are intended to fall within the scope of this invention.

While the invention has been described in terms of particular structures, devices and methods, those of skill in the art will understand based on the description herein that it is not limited merely to such examples. For example, the invention is not limited to forming an alignment mark in the bulk semiconductor wafer material but may be formed in either the bulk semiconductor material or in any layer formed over the bulk substrate, or in both. Therefore, the present invention should be construed as encompassing all such variations as fall within the scope of the claims that follow.

What is claimed is:

1. A method for forming an alignment mark in a semiconductor wafer comprising:

providing a semiconductor wafer;

etching said wafer in a processing cell, wherein said etching comprises:

a first etching step for pre-defining at least one alignment mark; and a second etching step for defining desired semiconductor device patterns and completing said at least one alignment mark;

wherein the at least one alignment mark and the desired semiconductor device patterns are defined by a resist mask which has been exposed using a reticle;

wherein the reticle is a half-tone reticle; and wherein during the first etching step, the at least one alignment mark is fully exposed by the resist mask and developed out whereas device portions of the substrate have a predetermined thickness of resist left thereon.

2. Method according to claim 1, wherein in said first etching step said wafer is partially etched at said at least one alignment mark, so that said at least one alignment mark has a first predetermined depth and remaining portions of the wafer remain covered by a lithography resist.

3. The method according to claim 2, wherein said second etching step comprises:

a first sub-step of removing said lithography resist from the wafer in at least one window for etching device features in said at least one window; and a second sub-step of etching at least one shallow trench in said at least one window.

4. The method of claim 3 wherein the second sub-step includes etching said at least one alignment mark to a predetermined second depth greater than the first predetermined depth.

5. Method according to claim 2, wherein said lithography resist is a plasma-developable resist.

6. The method of claim 1 wherein the first etching step uses a fluorine-based chemistry.

7. The method of claim 1 wherein the second etching step is a de-scum etching step comprised of an oxygen gas.

8. A method for forming an alignment mark in a semiconductor wafer comprising:

providing a semiconductor wafer;

etching said wafer in a processing cell, wherein said etching comprises:

a first etching step for pre-defining at least one alignment mark; and a second etching step for defining desired semiconductor device patterns and completing said at least one alignment mark;

wherein the at least one alignment mark and the desired semiconductor device pattern are defined by a resist mask which has been exposed using a reticle using a blading-off technique; and wherein during the first etching step, the at least one alignment mark is fully exposed by the resist mask and developed out whereas device portions of the substrate have a predetermined thickness of resist left thereon.

9. A method for forming an alignment mark in a semiconductor wafer, comprising:

providing a semiconductor wafer having a first region and a second region;

forming a resist layer over a surface of the semiconductor wafer, including over the first and second regions;

clearing the resist layer from over the first region without clearing the resist layer from over the second region, wherein the first region corresponds to where the alignment mark will be formed and the second region corresponds to a semiconductor device region;

partially etching the alignment mark in the first region using the resist layer without etching the second region and using the resist layer as an etch mask;

after partially etching the alignment mark, clearing the resist layer from portions over the second region; and after clearing the resist layer from portions over the second region, etching the second region using the resist layer as an etch mask while simultaneously completing the etch of the alignment mark.

10. The method of claim 9 wherein etching the second region comprises forming a shallow trench isolation region.

11. The method of claim 9 wherein the first region is a peripheral region and the second region is a central region.

12. A method for forming an alignment mark in a semiconductor wafer, comprising:

providing a semiconductor wafer having a first region and a second region;

forming a resist layer over a surface of the semiconductor wafer, including over the first and second regions;

clearing the resist layer from over the first region without clearing the resist layer from over the second region, wherein the first region corresponds to where the alignment mark will be formed and the second region corresponds to a semiconductor device region;

partially etching the alignment mark in the first region using the resist layer without etching the second region and using the resist layer as an etch mask;

after partially etching the alignment mark, clearing the resist layer from portions over the second region;

after clearing the resist layer from portions over the second regions, etching the second region while simultaneously completing the etch of the alignment mark;

wherein clearing the resist layer from over the first region without clearing the resist layer from over the second region is accomplished by underexposing the resist layer over the second region.

13. A method for forming an alignment mark in a semiconductor wafer comprising:

providing a semiconductor wafer;

forming a resist layer over a surface of the semiconductor wafer;

partially etching an alignment mark in the semiconductor wafer using the resist layer as an etching mask;

after partially etching an alignment mark, etching a feature in a device region of the semiconductor wafer using the resist layer as an etch mask, wherein the alignment mark is completed by etching the feature.

14. The method of claim 13 further comprising exposing the resist layer using a half-tone reticle.

15. The method of claim 13 further comprising exposing the resist layer using a reticle, and wherein a portion of the reticle is bladed-off during at least part of the exposing.

16. The method of claim 13, wherein the step of forming a resist layer comprises forming a plasma-developable resist layer.

* * * * *

UNITED STATES PATENT AND TRADEMARK OFFICE
CERTIFICATE OF CORRECTION

| | | |
|---|---|---|
| PATENT NO. | : 6,902,986 B2 | Page 1 of 1 |
| APPLICATION NO. | : 10/271653 | |
| DATED | : June 7, 2005 | |
| INVENTOR(S) | : John George Maltabes | |

It is certified that error appears in the above-identified patent and that said Letters Patent is hereby corrected as shown below:

In Column 6, Line 65, Claim No. 8:

Change "pattern" to --patterns--

In Column 8, Line 11, Claim No. 12:

Change the second word of the line "regions" to --region--

Signed and Sealed this

Twenty-second Day of May, 2007

JON W. DUDAS
*Director of the United States Patent and Trademark Office*